(12) United States Patent
De Weerdt (10) Patent No.: US 11,029,379 B2
(45) Date of Patent: Jun. 8, 2021

(54) BRIDGE MEMBER FOR A MAGNETIC RESONANCE EXAMINATION SYSTEM

(71) Applicant: KONINKLIJKE PHILIPS N.V., Eindhoven (NL)

(72) Inventor: Elwin De Weerdt, Eindhoven (NL)

(73) Assignee: Koninklijke Philips N.V., Eindhoven (NL)

(\*) Notice: Subject to any disclaimer, the term of this patent is extended or adjusted under 35 U.S.C. 154(b) by 0 days.

(21) Appl. No.: 16/483,450

(22) PCT Filed: Feb. 6, 2018

(86) PCT No.: PCT/EP2018/052842
§ 371 (c)(1),
(2) Date: Aug. 5, 2019

(87) PCT Pub. No.: WO2018/149683
PCT Pub. Date: Aug. 23, 2018

(65) Prior Publication Data
US 2020/0011949 A1    Jan. 9, 2020

(30) Foreign Application Priority Data
Feb. 14, 2017 (EP) .................................... 17155986

(51) Int. Cl.
*G01V 3/00* (2006.01)
*G01R 33/48* (2006.01)
*G01R 33/28* (2006.01)

(52) U.S. Cl.
CPC ......... *G01R 33/4828* (2013.01); *G01R 33/28* (2013.01); *G01R 33/4818* (2013.01)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS 4,774,957 A    10/1988 Nambu et al.
5,339,033 A    8/1994 Eilenberg et al.
(Continued)

FOREIGN PATENT DOCUMENTS

EP    2343103 A1    7/2011
JP    08191809 A    7/1996
(Continued)

OTHER PUBLICATIONS

Vavrek et al "Improving Field Homogeneity on Fat-Suppressed Cervical Spine Images" Proc. of the Int. Soc. for Mag. Reson. May 7, 2005, p. 1976.
(Continued)

*Primary Examiner* — Walter L Lindsay, Jr.
*Assistant Examiner* — Frederick Wenderoth (57) ABSTRACT

A bridge member containing MR responsive material is provided in an open space between body parts to establish a correspondence between the body parts. The MR responsive material generates magnetic resonance signals in response the RF excitation, so that between the separate body parts via the bridge member magnetic resonance signal are obtained from positions between which there is at most a limited spatial variation of the main magnetic field, so that phase ambiguities between the signals from these positions are avoided. Thus, chemical shift separation, notably water-fat separation though a region-of-interest containing several (both) body parts may rely on a smoothness condition imposed on the spatial distribution of the main magnetic field. This avoids artefacts, such as water-fat swaps when separating water and fat contributions in the reconstructed magnetic resonance image.

18 Claims, 6 Drawing Sheets

(58) Field of Classification Search
USPC .......................................................... 324/307
See application file for complete search history.

(56) References Cited

U.S. PATENT DOCUMENTS

| | | | |
|---|---|---|---|
| 5,995,863 A | 11/1999 | Farace et al. | |
| 2003/0210149 A1 | 11/2003 | Reisman et al. | |
| 2004/0186375 A1 | 9/2004 | Vavrek et al. | |
| 2005/0134263 A1 | 6/2005 | Vavrek et al. | |
| 2006/0270930 A1* | 11/2006 | Brasile | G01R 33/28 600/410 |
| 2009/0312626 A1 | 12/2009 | Hanrahan et al. | |
| 2015/0050223 A1* | 2/2015 | Perier | A61P 43/00 424/59 |

FOREIGN PATENT DOCUMENTS

| | | | |
|---|---|---|---|
| JP | 2010259735 A | 11/2010 | |
| KR | 20160122684 A | 10/2010 | |

OTHER PUBLICATIONS

Cox et al Low-Cost Device for Avoiding Bulk Susceptibility Artifacts in Chemical Selective Fat Saturation MR of the Head an Neck, AJNR. vol. 16, No. 6, Jun. 1995 p. 1367-1369.
International Search Report from PCT/EP2018/052842 dated Jul. 9, 2018.

\* cited by examiner

BRIDGE MEMBER FOR A MAGNETIC RESONANCE EXAMINATION SYSTEM

CROSS REFERENCE TO RELATED APPLICATIONS

This application is a U.S. national phase application of International Application No. PCT/EP2018/052842 filed on Feb. 6, 2018, which claims the benefit of EP Application Serial No. 17155986.7 filed on Feb. 14, 2017 and is incorporated herein by reference.

FIELD OF THE INVENTION

The invention pertains to a bridge member to be placed between separated body parts of a patient to be examined.

Magnetic resonance imaging (MRI) methods utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MRI method in general, the body of the patient to be examined is arranged in a strong, uniform magnetic field B0 whose direction at the same time defines an axis (normally the z-axis) of the co-ordinate system to which the measurement is related. The magnetic field B0 causes different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) while the corresponding magnetic field B1 of this RF pulse extends perpendicular to the z-axis, so that the magnetization performs a precession motion about the z-axis. The precession motion describes a surface of a cone whose angle of aperture is referred to as flip angle. The magnitude of the flip angle is dependent on the strength and the duration of the applied electromagnetic pulse. In the example of a so-called 90° pulse, the magnetization is deflected from the z axis to the transverse plane (flip angle 90°).

After termination of the RF pulse, the magnetization relaxes back to the original state of equilibrium, in which the magnetization in the z direction is built up again with a first time constant T1 (spin lattice or longitudinal relaxation time), and the magnetization in the direction perpendicular to the z-direction relaxes with a second and shorter time constant T2 (spin-spin or transverse relaxation time). The transverse magnetization and its variation can be detected by means of receiving RF antennae (coil arrays) which are arranged and oriented within an examination volume of the magnetic resonance examination system in such a manner that the variation of the magnetization is measured in the direction perpendicular to the z-axis. The decay of the transverse magnetization is accompanied by dephasing taking place after RF excitation caused by local magnetic field inhomogeneities facilitating a transition from an ordered state with the same signal phase to a state in which all phase angles are uniformly distributed. The dephasing can be compensated by means of a refocusing RF pulse (for example a 180° pulse). This produces an echo signal (spin echo) in the receiving coils.

In order to realize spatial resolution in the subject being imaged, such as a patient to be examined, constant magnetic field gradients extending along the three main axes are superposed on the uniform magnetic field B0, leading to a linear spatial dependency of the spin resonance frequency. The signal picked up in the receiving antennae (coil arrays) then contains components of different frequencies which can be associated with different locations in the body. The signal data obtained via the receiving coils correspond to the spatial frequency domain of the wave-vectors of the magnetic resonance signal and are called k-space data. The k-space data usually include multiple lines acquired of different phase encoding. Each line is digitized by collecting a number of samples. A set of k-space data is converted to an MR image by means of Fourier transformation.

The transverse magnetization dephases also in presence of constant magnetic field gradients. This process can be reversed, similar to the formation of RF induced (spin) echoes, by appropriate gradient reversal forming a so-called gradient echo. However, in case of a gradient echo, effects of main field inhomogeneities, chemical shift and other off-resonances effects are not refocused, in contrast to the RF refocused (spin) echo.

BACKGROUND OF THE INVENTION

In the field of magnetic resonance imaging it is a known issue that water and fat may appear shifted in the image. This chemical shift refers to small changes in resonant frequency due to different molecular environments of nuclei, notably in water and e.g. tri-glycerides. The difference in resonance frequencies of portions in water or in fat is typically about 3.4 parts per million (ppm). When image intensities are assigned in the reconstructed image, therefore, the location of fat protons will be spatially mis-mapped which may result in artificial white or dark bands, one-to-several pixels in width, on either side of an anatomic object. The artefact is most commonly seen around water-containing structures (liver, kidneys, optic nerves, muscles, nerve fascicles) surrounded by fat.

Per se known techniques, such as Dixon-type acquisition and reconstruction techniques are able to separate the signals originating form water-like tissue and from fat-like tissue.

From the US-patent application US2003/0210149 a fat suppression enhancer for use with magnetic resonance imaging is known.

The known fat suppression enhancer aims at improving fat saturation. The known fat suppression enhancer is made from tissue equivalent plastic. The known fat suppression enhancer is placed between the receiving coil and the body of the patient to be examined. In this way the known fat suppression enhancer eliminates the skin air interface.

SUMMARY OF THE INVENTION

An object of the invention is to improve robustness of water-fat separation in magnetic resonance imaging.

This object is achieved by the bridge member of the invention which establishes a correspondence between separated body parts of a patient to be examined, the bridge member containing a MR responsive material that has a magnetic resonance response that resembles fat-like tissue's magnetic resonance response.

In the framework of the invention, to establish a correspondence between the body parts, the bridge member is configured such that between the body parts, there are one or usually several signal-positions from which magnetic resonance signals of non-zero signal level are acquired. That is, the correspondence is formed by a (possibly discontinuous) path of non-zero signal positions through the bridge member. The bridge member contains the MR responsive material that in response to RF excitation emits magnetic resonance signals having a signal-to-noise ratio (SNR) that is appreciable so that the MR responsive material is rendered visible in the reconstructed magnetic resonance image. For example the MR responsive material may generate a magnetic response signal of which the SNR is at least 10%, at least 20% or at least 50% of the average SNR of the magnetic resonance signals from the region-of-interest that is imaged of the patient to be examined. The signal-positions are such that (i) neighbouring signal-positions are at a distance less than a typical distance over which the main magnetic field strength varies appreciably and (ii) signal-locations that are closest to the respective body parts are at a distance to the body part that is less than the typical distance over which the main magnetic field strength varies appreciably. In the context of the present invention, an appreciable variation of the main magnetic field of the magnetic resonance examination system is a variation that induces a B0-induced phase shift (B0-induced phase shift) of more than a predetermined threshold-value in the magnetic resonance signal. Thus, between neighbouring signal-positions of the bridge member B0-induced phase shifts induced by the spatial variations of the main magnetic field of the magnetic resonance signals do not exceed the predetermined threshold. Moreover, the B0-induced phase shift between magnetic resonance signals from the body parts and the closest signal-position does not exceed the predetermined threshold. The predetermined threshold is at most $2\pi$ so that no B0-induced phase shifts of more than $2\pi$ may occur and phase unwrapping is not needed. The predetermined threshold may also be set to a lower value of e.g. $\pi$, $\pi/2$, $\pi/3$ or $\pi/6$. At these lower values of the predetermined threshold B0-induced phase shifts between magnetic resonance signal form signal-positions remain even smaller which further avoids ambiguities in the phases of the magnetic resonance signals. That is, the signals generated from the bridge member enable to impose a smoothness condition on the main magnetic field variations in the water-fat separation. This holds even for relatively stronger main magnetic field variations that occur away from the magnetic resonance examination system's magnet isocentre. That is, the bridge member achieves that in between the body parts signal voids are reduced or even avoided altogether, which support to impose conditions of the main magnetic field varying smoothly in space.

The bridge member may be configured in various manners. For example the bridge member may be a member filling the region between the body parts and made of or including a magnetic resonance responsive material. The bridge member may be formed from multiple units of which neighbouring units are at a distance from each other over which no appreciable variation of the main magnetic field occurs. The bridge member may further be formed by an object that may have different functions as well. For example the bridge member may be formed by a support or fixation cushion. Also, the bridge member may be formed by a patient support on which the patient to be examined is positioned during a magnetic resonance examination.

The bridge member may contain a MR responsive material of which the magnetic resonance response resembles that of fat-like tissue, i.e. fat-like material. Thus, from signal-positions separated at a distance less than the distance over which the main magnetic field varies appreciably, magnetic resonance signals are acquired that are similar to magnetic resonance signals from fat-like tissue from the body parts. In other words, between sub-areas representing fat-like tissue in the image of the respective separate body parts the correspondence between the body parts is realised along pixels having image values that correspond to fat-like tissue through the separating region in the image between the sub-areas. This is achieved in that in the image the separating region shows up as if it were fat-like tissue similar to the fat-like tissue in the separated body parts. In this way a connection in the image is created that allows improved robustness in the conventional, e.g. Dixon-type, water fat-separation. This improved robustness is based on the validity of the assumption of smooth variation of the main magnetic field also along at least a path between sub-areas of fat-like tissue in the respective body parts. That is, when performing water-fat separation for the respective sub-areas of fat-like tissue in the separate body parts, the non-zero signal levels from the bridge member in the region between the separate body parts allow to use the constraint of smooth spatial variations of the main magnetic field. That is, no large B0-induces phase shifts occur between signals from neighbouring positions in the region between the body parts occur through the region between the body parts. The bridge member forms a correspondence of a chain of non-zero signals along neighbouring positions in the bridge member and having no phase ambiguities. Also no signal of very low level or zero signal level of which the phase is inaccurately determined may occur. Over this correspondence between the body parts through the separating region, the main magnetic field's spatial variations are correctly assumed to be smooth can be successfully and robustly imposed as a constraint. Consequently, water-fat separation notably based on a Dixon-type approach, in the image representing the separate body parts and the bridge member is more robust. This is achieved as paths connecting image voxels between the image representations of the separate body parts and through the representation of the bridge member pass through voxels that have values like tissue, instead of air or void.

The separated body parts are body parts that are separated by, or between which there is a region without tissue. Typically the body parts may be the patient's limbs, such as the legs that are separated by air space between them. In another example one body part may be a patient's arm and the other body part the patient's torso. In yet another example the separating region may be the air space between the patient shoulder and neck.

The fat-like material may have a magnetic resonance response such that it preferably does not show up in the water image that is formed in the water-fat separation. Hence, preferably the fat-like material is, such that in the reconstructed magnetic resonance image the separating region between the respective body parts has image values close to the image values of region of fat-like tissue in the body parts. The fat-like material has a magnetic resonance signal response close to that of human fat. The fat-like material may closely satisfy e.g. a multi-peak spectral model of fat that is used in the Dixon-type water-fat separation. The fat-like material may further have a relaxation time similar to that of human fat. Small deviations are allowed, however, the larger such deviations the more 'signal leakage' will be experienced of fat-signal into the water image upon water-fat separation Notably, it is to be avoided that water-like voxels occur in the representation of the bridge member in the water-image as that could confound maximum intensity projections.

The bridge member only needs to make local physical contact or have close proximities with the (both) separated body parts. However, as the areas where the bridge member makes physical contact or establishes regions where the bridge member is in close proximity to its neighbouring body part with the body parts are larger, the easier to achieve the improved robustness of the (Dixon-type) water fat separation. Notably as the areas of physical contact or close proximity between the bridge member and the body parts are larger, the more connecting paths of non-void voxels between the separate body parts through the bridge member and the better the smoothness constraint on the main magnetic field variations can be imposed.

Notably, the bridge member of the invention differs from the known fat suppression enhancer. The bridge member achieves a more robust water fat separation in reconstruction and does not add to fat suppression in the received magnetic resonance signals.

In brief, the present invention pertains to magnetic resonance imaging, notably of separate body parts with open space between them. A bridge member containing MR responsive material is provided in the open space to establish a correspondence between the body parts. The MR responsive material generates magnetic resonance signals in response the RF excitation, so that between the separate body parts via the bridge member magnetic resonance signal are obtained from positions between which there is at most a limited spatial variation of the main magnetic field, so that phase ambiguities between the signals from these positions are avoided. Thus chemical shift separation, notably water-fat separation through a region-of-interest containing several (both) body parts may rely on a smoothness condition imposed on the spatial distribution of the main magnetic field. This avoids artefacts, such as water-fat swaps when separating water and fat contributions in the reconstructed magnetic resonance image.

In a preferred embodiment, the bridge member is formed by a patient support that carries the patient to be examined in a magnetic resonance examination system. The patient may be positioned on the patient support such that the separated body parts, e.g. the patient's limbs connect to the patient support. The patient support is provided with the MR responsive material, e.g. a layer of MR responsive material extending over or just beneath the patient support's surface facing the patient to be examined. Because there are regions of contact or close proximity to the patient support with contact or close to the MR responsive material and the MR responsive material generates magnetic resonance signals of non-zero signal level, the patient support effectively establishes a correspondence between the body parts (e.g. legs, or arm and torso) along which there are signal-positions between which phase shifts do no exceed the predetermined threshold, e.g. less than $2\pi$.

In a preferred embodiment the bridge member is formed by the patient support and is flexible so that it is deformed by the weight of the patient to be examined. The deformation is such that the bridge member becomes shaped to establish areas of contact or close proximity between the body parts and fills a substantial portion of the separation between the body parts so that non-zero signals are obtained mostly throughout the separation. The bridge member may be formed as a deformable mattress. When for examination the patient is placed on the deformable mattress, in the separating region between the patient's legs, the mattress bulges out in between the patients legs and establishes wider areas of closer contact or close proximity between the legs. In the magnetic resonance image of the pair of legs, in the separating space between them the image shows as if there were fat-like tissue in the separating space and accordingly more robust water-fat separation is enabled. Slight indenting as occurs with a standard mattress due to the weight of the patient to be examined is usually sufficient.

In another example of the invention, the bridge member is formed by stabilisation bag that may keep the separate body parts in position. For example, the patient's legs may be immobilised by the stabilisation bag for contrast-enhanced dynamic magnetic resonance imaging (DCE-MRI) of the lower limbs. Conventional stabilisation bags are only little deformable, but is appears that they provide sufficient areas of contact or close proximity to the separate body parts to establish correspondence between them. The stabilisation bag counteracts or blocks the motion of the legs is counteracted during acquisition of magnetic resonance signal so that motion artefacts are avoided. According to a further example of the invention the stabilisation bag contains the MR responsive material. Hence the stabilisation bag shows in the reconstructed magnetic resonance image as if it were fat-like tissue.

Hence, an insight of some of the embodiments of the invention is to make use of a component that is employed in the magnetic resonance examination for some other function, also as the bridge member, establishing contact or close proximity between the separated body parts. Hence, in these embodiments no additional component is needed.

In a further example of the invention, the MR responsive material is disposed along the bridge member's outer layer or outline. This achieves that only a small amount of the MR responsive material is needed. Moreover, this achieves that it is easy to make physical contact with or close proximity between the bridge member and one or both of the separated body parts. As the MR responsive material is disposed along the bridge member's outline, a continuous path along image positions with image values like those of fat-like tissue is formed connecting the areas of contact or close proximity of the bridge member's areas of contact or close proximity with the body parts, e.g. the legs. Alternatively, the MR responsive material may be disposed as various patches while neighbouring patches are closer than the typical length over which the main magnetic field strength varies appreciably.

The fat-like material consists mainly of saturated —CH2- chains. These materials, e.g. Vaseline, have a magnetic resonance response that closely resembles fat-like tissue, notably lipids. The fat-like material may be fairly homogeneous so as to achieve a spectroscopy narrowly peaked magnetic resonance response. In order to have adequate deformability a viscous fluid may be employed of mainly saturated CH2-chains that is contained in a plastic bag. The bridge member may be size about 3×10×30 cm, which proves to work well in practice.

In another example of the bridge member of the invention, the MR responsive material as well as any other constituent of the bridge member do not generate a noticeable magnetic resonance signal level in the frequency range of water. Accordingly, in the water-fat separated reconstructed water image and fat image, the bridge member does not show up noticeable in the water image. In this maximum intensity projections (MIPs) are not affected by the bridge member. This is clinically relevant, e.g. in contrast enhanced MR angiography (CE-MRA). For inspection by a radiologist the MIP is made of the water only image for the image acquisition with contrast injected. The water image is used because it represents the vessels more clearly. Fat signal is typically bright which would compromise the MIP images blocking the viewing of the vessels hence compromising diagnosis. An acceptable level of bridge member signal would have to be significantly less than that of the vessels. The smaller the vessels viewed, the lower the acceptable signal level. More generally, the MR responsive material's magnetic resonance response spectrum is significantly distinct from the magnetic resonance response spectrum of watery tissue. In the event the MR response spectrum is represented by a single peak, the frequencies of the peaks of the MR responsive material and of the water (watery tissue), respectively, should be different. The more frequency separation between the magnetic resonance response spectrum of the MR response material and of water, the better the signal from the MR responsive material is eliminated from the reconstructed water image.

These and other aspects of the invention will be elucidated with reference to the embodiments described hereinafter and with reference to the accompanying drawing wherein:

DETAILED DESCRIPTION OF EMBODIMENTS

Figure 1:
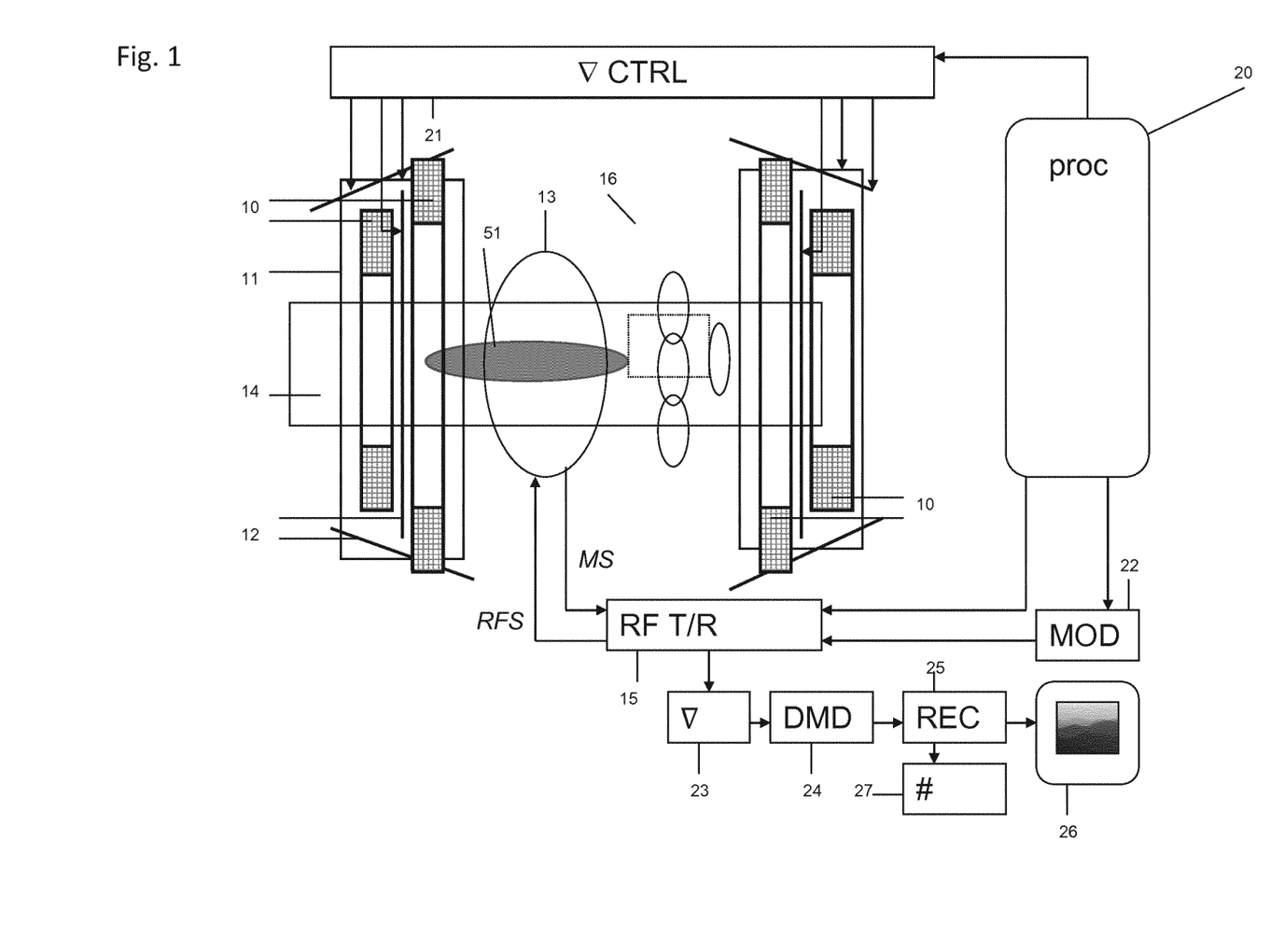
FIG. 1 shows a diagrammatic representation of a magnetic resonance examination system in which the invention is employed.

FIG. 1 shows diagrammatically a magnetic resonance imaging system in which the invention is used. FIG. 1 shows a diagrammatic representation of a magnetic resonance examination system in which the invention is employed. The magnetic resonance imaging system includes a main magnet with a set of main coils 10 whereby the steady, uniform magnetic field is generated. The main coils are constructed, for example in such a manner that they from a bore to enclose a tunnel-shaped examination space. The patient to be examined is placed on a patient carrier which is slid into this tunnel-shaped examination space. The magnetic resonance imaging system also includes a number of gradient coils 11, 12 whereby magnetic fields exhibiting spatial variations, notably in the form of temporary gradients in individual directions, are generated so as to be superposed on the uniform magnetic field. The gradient coils 11, 12 are connected to a gradient control 21 which includes one or more gradient amplifier and a controllable power supply unit. The gradient coils 11, 12 are energised by application of an electric current by means of the power supply unit 21; to this end the power supply unit is fitted with electronic gradient amplification circuit that applies the electric current to the gradient coils so as to generate gradient pulses (also termed 'gradient waveforms') of appropriate temporal shape. The strength, direction and duration of the gradients are controlled by control of the power supply unit. The magnetic resonance imaging system also includes transmission and receiving antennae (coils or coil arrays) 13, 16 for generating the RF excitation pulses and for picking up the magnetic resonance signals, respectively. The transmission coil 13 is preferably constructed as a body coil 13 whereby (a part of) the object to be examined can be enclosed. The body coil is usually arranged in the magnetic resonance imaging system in such a manner that the patient 30 to be examined is enclosed by the body coil 13 when he or she is arranged in the magnetic resonance imaging system. The body coil 13 acts as a transmission antenna for the transmission of the RF excitation pulses and RF refocusing pulses. Preferably, the body coil 13 involves a spatially uniform intensity distribution of the transmitted RF pulses (RFS). The same coil or antenna is generally used alternately as the transmission coil and the receiving coil. Typically, a receiving coil includes a multiplicity of elements, each typically forming a single loop. Various geometries of the shape of the loop and the arrangement of various elements are possible. The transmission and receiving coil 13 is connected to an electronic transmission and receiving circuit 15.

It is to be noted that is that there is one (or a few) RF antenna elements that can act as transmit and receive; additionally, typically, the user may choose to employ an application-specific receive antenna that typically is formed as an array of receive-elements. For example, surface coil arrays 16 can be used as receiving and/or transmission coils. Such surface coil arrays have a high sensitivity in a comparatively small volume. The receiving coil is connected to a preamplifier 23. The preamplifier 23 amplifies the RF resonance signal (MS) received by the receiving coil 16 and the amplified RF resonance signal is applied to a demodulator 24. The receiving antennae, such as the surface coil arrays, are connected to a demodulator 24 and the received pre-amplified magnetic resonance signals (MS) are demodulated by means of the demodulator 24. The pre-amplifier 23 and demodulator 24 may be digitally implemented and integrated in the surface coil array. The demodulated magnetic resonance signals (DMS) are applied to a reconstruction unit. Note that the reconstructing function to reconstruct the magnetic resonance image from the acquired magnetic resonance signal may also be performed at a remote location, even outside of the building or the organisation where the magnetic resonance examination system is set up or controlled by. The reconstruction may be done by processing capabilities elsewhere, e.g. in 'the cloud' and the data files representing the reconstructed magnetic resonance image returned to the magnetic resonance examination system. The demodulator 24 demodulates the amplified RF resonance signal. The demodulated resonance signal contains the actual information concerning the local spin densities in the part of the object to be imaged. Furthermore, the transmission and receiving circuit 15 is connected to a modulator 22. The modulator 22 and the transmission and receiving circuit 15 activate the transmission coil 13 so as to transmit the RF excitation and refocusing pulses. In particular the surface receive coil arrays 16 are coupled to the transmission and receive circuit by way of a wireless link. Magnetic resonance signal data received by the surface coil arrays 16 are transmitted to the transmission and receiving circuit 15 and control signals (e.g. to tune and detune the surface coils) are sent to the surface coils over the wireless link.

The reconstruction unit derives one or more image signals from the demodulated magnetic resonance signals (DMS), which image signals represent the image information of the imaged part of the object to be examined. The reconstruction unit 25 in practice is constructed preferably as a digital image processing unit 25 which is programmed so as to derive from the demodulated magnetic resonance signals the image signals which represent the image information of the part of the object to be imaged. The signal on the output of the reconstruction is applied to a monitor 26, so that the reconstructed magnetic resonance image can be displayed on the monitor. It is alternatively possible to store the signal from the reconstruction unit 25 in a buffer unit 27 while awaiting further processing or display. The reconstruction unit may be located remotely from the magnetic resonance examination system and have a data-connection to the magnetic resonance examination system's host computer.

The magnetic resonance imaging system according to the invention is also provided with a control unit 20, for example in the form of a computer which includes a (micro) processor. The control unit 20 controls the execution of the RF excitations and the application of the temporary gradient fields. To this end, the computer program according to the invention is loaded, for example, into the control unit 20 and the reconstruction unit 25.

The bridge member 51 is placed on the patient support 14.

Figure 2:
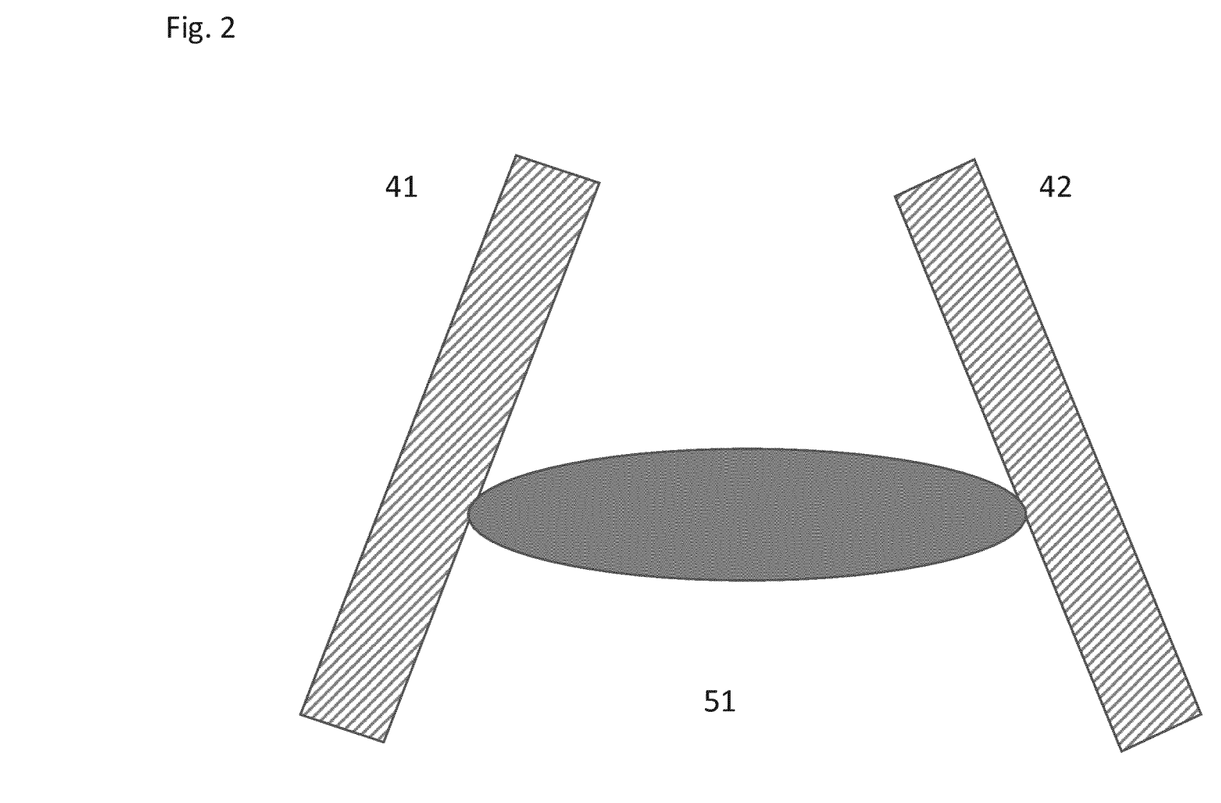
FIG. 2 shows a first example of a bridge member of the invention.

FIG. 2 shows a first example of a bridge member of the invention. The bridge member 51 is formed as a single member that may be placed between the body parts 41,42. The bridge member 51 is made of the fat-like material, so that magnetic resonance signal resembling those of human fat may be produced throughout the volume of the bridge member. This enables robust water fat-separation in the magnetic resonance image showing both body parts and in which the bridge member will show up only in the fat-image and not in the water-image.

Figure 3:
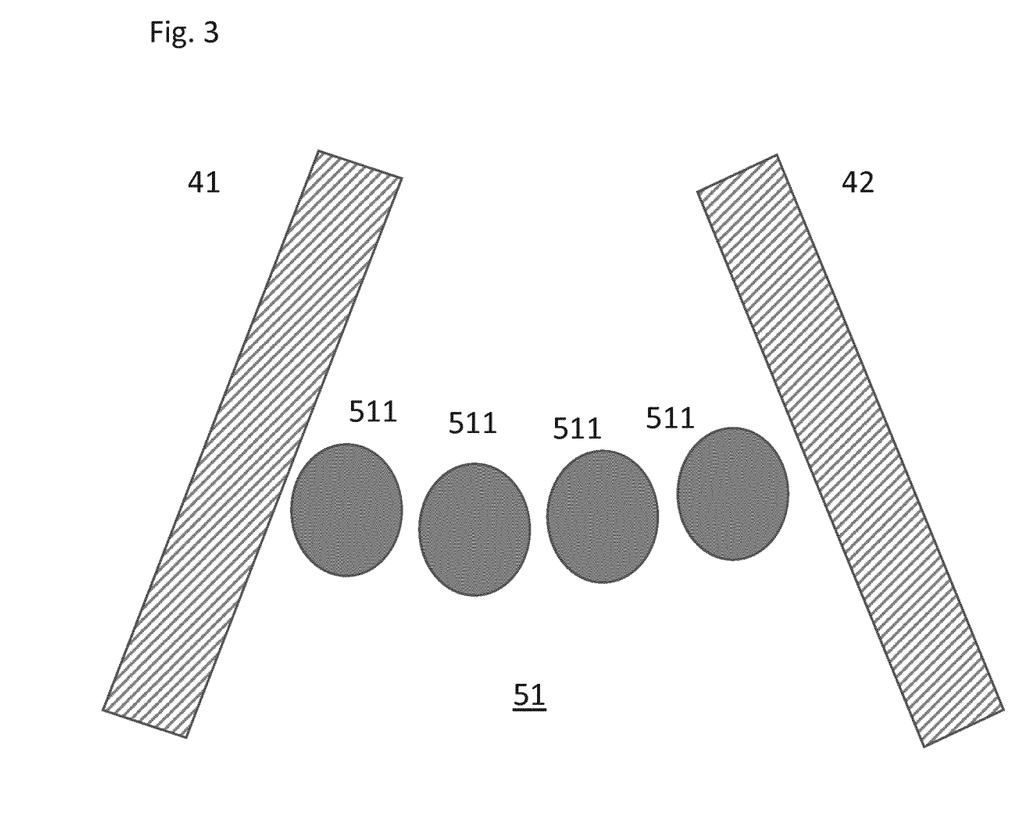
FIG. 3 shows a second example of a bridge member of the invention.

FIG. 3 shows a second example of a bridge member of the invention. The bridge member 51 is formed from several bridge units 511 that contain fat-like material. The neighbouring bridge unit are at a distance of at most a distance over which the main magnetic field varies appreciably. Accordingly, magnetic resonance signal from neighbouring bridge units 511 may have a phase-shift of at most the predetermined threshold of $2\pi$ or a smaller value.

Figure 4:
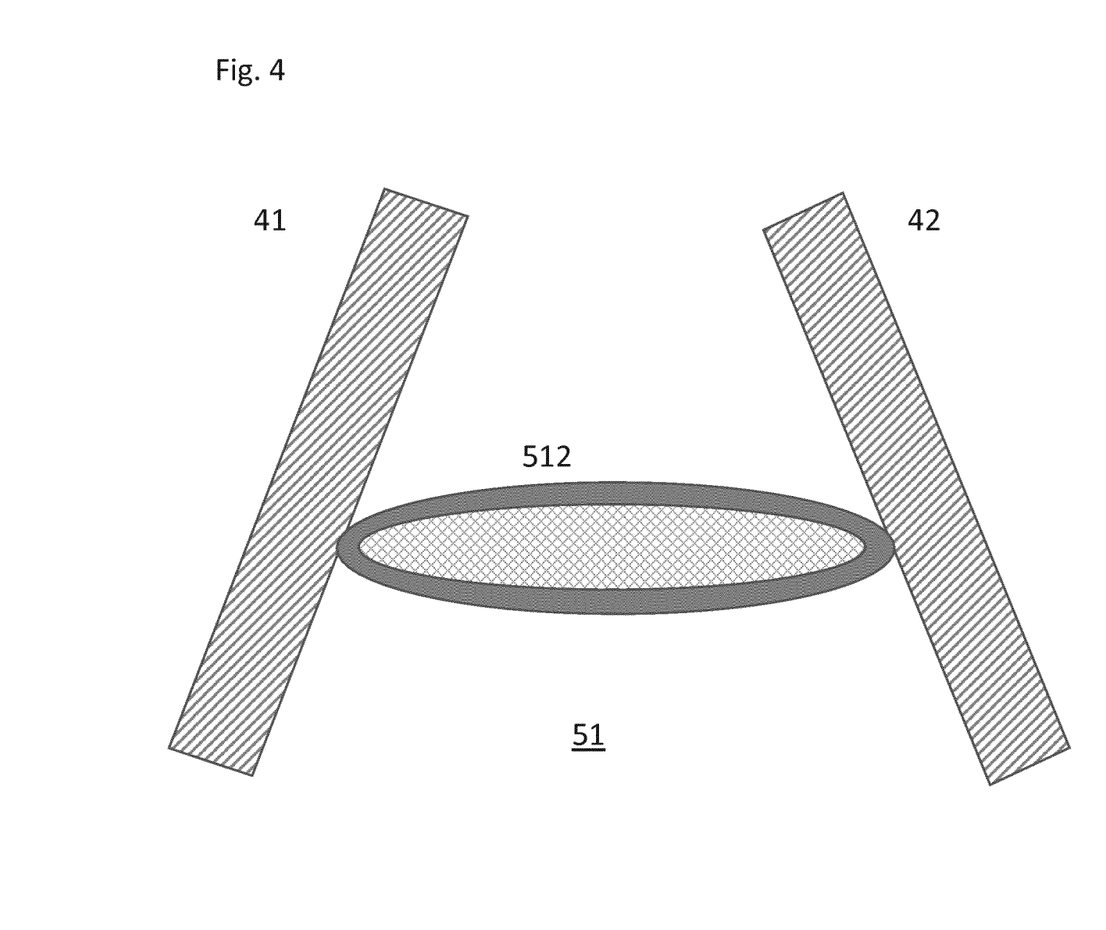
FIG. 4 shows a third example of a bridge member of the invention.

FIG. 4 shows a third example of a bridge member of the invention. In the example of FIG. 4, the bridge member 51 is a single member which has a layer 512 of fat-like material disposed along its outline. This layer of fat-like material may be just below the outer surface of the bridge member 51.

Accordingly, magnetic resonance signal from positions spaced apart less than the typical distance over which the main magnetic field varies appreciably have phase-shift of at most the predetermined threshold of $2\pi$ or a smaller value.

Figure 5:
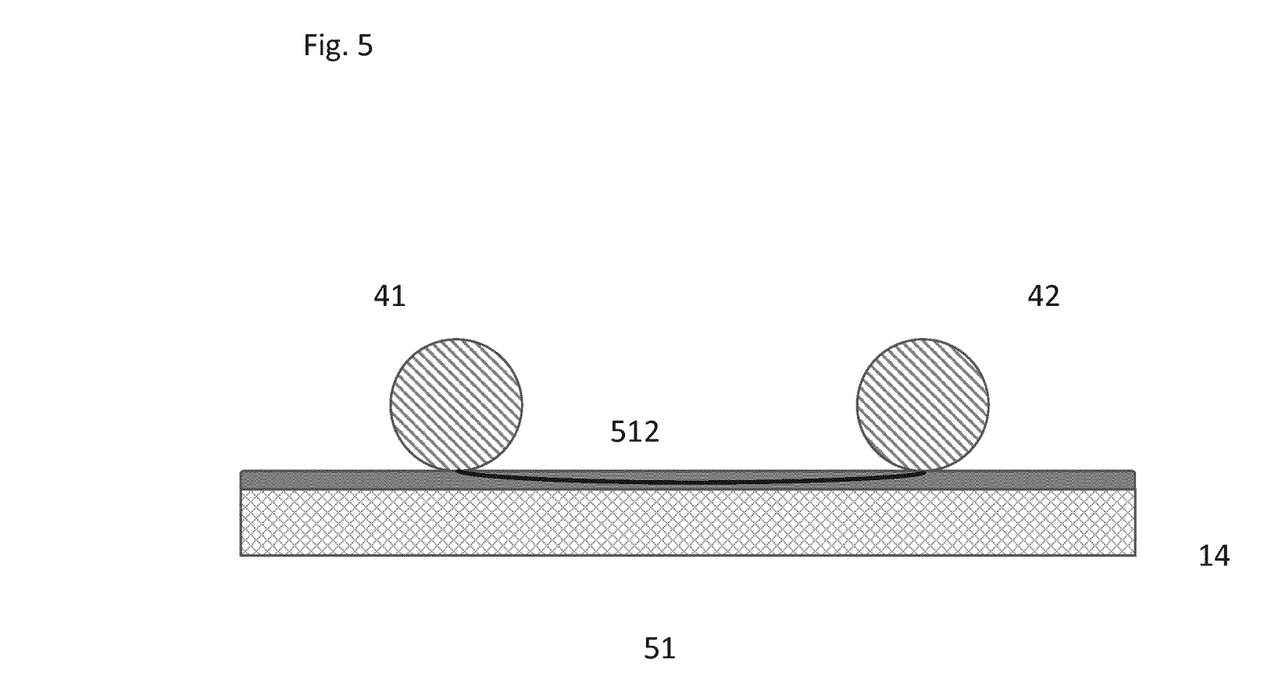
FIG. 5 shows a fourth example of a bridge member of the invention incorporated in the patient support.

FIG. 5 shows a fourth example of a bridge member of the invention incorporated in the patient support 14. A layer of fat-like material 512 is disposed at or just below the surface to face the patient to be examined. When in use the separate body parts, e.g. patient's legs or torso and arms make contact or are in close proximity with the surface of the patient carrier and are close to the layer of fat-like material such that the magnetic resonance signals from the body part and from the layer of fat like material may be less than the predetermined threshold of $2\pi$ or less. Further, the layer 512 of fat-like material allows a path through the layer of positions that generate magnetic resonance signals and B0-induced phase shifts between adjacent position along the path (shown as a drawn line) are less than the predetermined threshold. Accordingly, along the path there are no large B0-induced phase shifts between adjacent positions so that phase ambiguities along the path from one body part to the other cannot occur.

Figure 6:
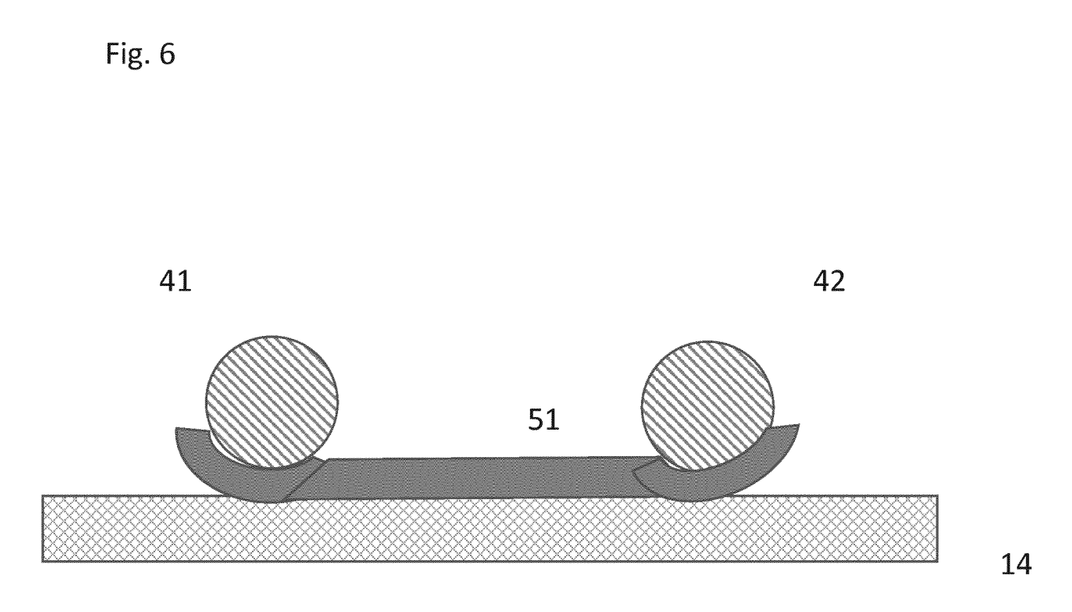
FIG. 6 shows a fifth example of a bridge member of the invention.

FIG. 6 shows a fifth example of a bridge member of the invention. The bridge member 51 of FIG. 6 is formed as a flexible member that can be placed on the surface of the patient carrier. When the patient to be examined is place on the patient support the body parts are supported by the flexible bridge member. Hence, owing to the deformation of the flexible bridge member, relatively wider contact or close proximity areas are formed between the flexible bridge member and the respective body parts. These wider contact or close proximity areas ensure that that the magnetic resonance signals from the body part and from the layer of fat like material may be less than the predetermined threshold of $2\pi$ or less. Further, the bridge member containing the fat-like material allows a path through the bridge member of positions that generate magnetic resonance signals and B0-induced phase shifts between adjacent position along the path (shown as a drawn line) are less than the predetermined threshold. Accordingly, phase ambiguities between magnetic resonance signals from ten respective body parts are avoided.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A bridge member for use in a magnetic resonance examination system and to establish a correspondence between MR signals from separated body parts of a patient to be examined, the bridge member containing a MR responsive fat-like material that has a magnetic resonance response that in response to RF excitation emits magnetic resonance signals having an appreciable signal-to-noise ratio (SNR) and said response resembles fat-like tissue's magnetic resonance response, wherein the bridge member is formed by a patient support and contains the MR responsive material at least along the surface to face the patient to be examined, such that the separated body parts and the bridge member form a path between the separated body parts along which path the fat-like MR response is emitted.

2. A bridge member configured for use in a magnetic resonance examination system and to establish a phase correspondence between magnetic signals emitted from separated body parts of a patient to be examined, the bridge member containing a MR responsive fat-like material that has a magnetic resonance response that in response to RF excitation emits magnetic resonance signals having an appreciable signal-to-noise ratio (SNR) and said response resembles fat-like tissue's magnetic resonance response, wherein the bridge member is formed by a stabilisation bag that is shaped and/or is deformable to keep the separate body parts in position and provide a magnetic signal emitting path connecting the separated body parts.

3. A method of using a bridge member in a magnetic resonance examination system to establish a correspondence in a phase of MR signals from separated body parts of a patient to be examined, the method comprising positioning a bridge member comprising a MR responsive fat-like material in response to RF excitation emits magnetic resonance signals having an appreciable signal-to-noise ratio (SNR) such that said response resembles fat-like tissue's magnetic resonance response along a path of the bridge member connecting the separated body parts.

4. The bridge member as claimed in claim 1, wherein the bridge member includes a flexible member configured to be placed on a surface of a patient carrier and be flexibly deformed by weight of the patient to be examined into a shape that contacts or is in close proximity to each of the separated body parts and conforms with surface portions of each of the separated body parts.

5. The bridge member as claimed in claim 1 wherein the MR responsive material is disposed in at least part of (i) an outer layer or (ii) along at least part of the bridge member's outline.

6. The bridge member as claimed in claim 1, wherein the fat-like material consists mainly of saturated —CH2- chains.

7. The magnetic resonance examination system provided with bridge member of claim 1.

8. The bridge member as claimed in claim 1, wherein in water-fat separation imaging, the fat-like material generates a bright fat signal and does not generate a significant water signal.

9. The bridge member as claimed in claim 1, wherein in angiography, a level of generated MR signal from the fat-like material is less than a level of MR signals from blood vessels.

10. The bridge member as claimed in claim 1, wherein magnetic resonance signals across the bridge member between one of the separated body parts and another undergo a phase shift of $2\pi$ or less.

11. The bridge member as claimed in claim 2, wherein in water-fat separation imaging, the fat-like material generates a bright fat signal and does not generate a noticeable water signal.

12. The bridge member as claimed in claim 2, wherein in angiography, a level of generated MR signal from the fat-like material is less than a level of MR signals from vessels.

13. The bridge member as claimed in claim 2, wherein magnetic resonance signals across the bridge member between one of the body parts and another undergo a $B_0$ induced phase shift of $2\pi$ or less.

14. The method of using the bridge member as claimed in claim 3, further including:
    generating separate water and fat images of the separated body parts and the bridge member, wherein the bridge member is visible in the fat image forming a path between the separated body parts in the fat image and not in the water image.

15. The method of using the bridge member as claimed in claim 3, further including:
    from phase shifts along the path from a first of the separated bod parts to a second of the separated body parts, determining a phase correspondence in MR signals from the first and second body parts.

16. The method of using the bridge member as claimed in claim 15, wherein a phase shift across the bridge member between the first and second body parts is $2\pi$ or less.

17. The method of using the bridge member as claimed in claim 3, further including:
    generating angiographic images such that MR signals from vessels are stronger than MR signals from the fat-like material in the bridge member.

18. The method of using the bridge member as claimed in claim 3, wherein the bridge member includes a flexible mattress, and wherein the method further includes:
    placing the mattress on a patient support,
    positioning a patient on the mattress such that weight of the patient causes the mattress to deform into conformity with the separated body parts and into a space between the separated body parts forming a path of the fat-like material between the separated body parts.

* * * * *